(12) United States Patent
Wilding et al.

(10) Patent No.: US 11,221,154 B2
(45) Date of Patent: Jan. 11, 2022

(54) PASSIVE ROOF EXHAUSTING SYSTEM

(71) Applicant: Amazon Technologies, Inc., Seattle, WA (US)

(72) Inventors: Robert David Wilding, Seattle, WA (US); Peter George Ross, Olympia, WA (US); Geri-Ann Quinlivan, Seattle, WA (US); Alan Donald Gillooly, Auburn, WA (US); Sean Patrick Abbott, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 16/147,368

(22) Filed: Sep. 28, 2018

(65) Prior Publication Data
US 2019/0032938 A1 Jan. 31, 2019

Related U.S. Application Data

(63) Continuation of application No. 14/971,793, filed on Dec. 16, 2015, now Pat. No. 10,088,181.

(51) Int. Cl.
*F24F 7/02* (2006.01)
*F24F 7/10* (2006.01)
(Continued)

(52) U.S. Cl.
CPC ............... *F24F 7/02* (2013.01); *E04B 7/18* (2013.01); *H05K 7/20709* (2013.01);
(Continued)

(58) Field of Classification Search
CPC ........ F24F 7/02; F24F 7/10; F24F 7/00; F24F 7/007; F24F 2007/001; F24F 2007/004;
(Continued)

(56) References Cited

U.S. PATENT DOCUMENTS 1,654,855 A * 1/1928 Bastien .................. F23L 17/10
454/363
2,300,842 A 11/1942 Leslie
(Continued)

FOREIGN PATENT DOCUMENTS

AU 2016370485 11/2018
CN 102159893 A 8/2011
(Continued)

OTHER PUBLICATIONS

AU App. No. AU2018250462, "First Examination Report," dated Jun. 14, 2019, 6 pages.
(Continued)

*Primary Examiner* — Jessica L Laux
(74) *Attorney, Agent, or Firm* — Kilpatrick Townsend & Stockton LLP

(57) ABSTRACT

A system for passively exhausting air from a structure includes at least one pair of modules arranged on a roof of the structure. Each module has an exhaust face on one side and a sloped surface on the opposite side, and can receive exhaust air that flows upward from inside the structure. The modules can be arranged in pairs facing one another, with one of the sloped surfaces facing a direction of an environmental flow of air, so that the environmental air can flow up the sloped surface of one module and down the sloped surface of the other module without impinging on the exhaust faces of either module. The pairs can also be arranged side-by-side in an array, which can be expanded with additional pairs of modules to exhaust from the structure at a greater rate.

11 Claims, 14 Drawing Sheets

(51) Int. Cl.
 *E04B 7/18* (2006.01)
 *H05K 7/20* (2006.01)
(52) U.S. Cl.
 CPC ............ *H05K 7/20745* (2013.01); *F24F 7/10* (2013.01); *F24F 2221/16* (2013.01); *F24F 2221/52* (2013.01)
(58) Field of Classification Search
 CPC ...... F24F 13/20; F24F 13/082; F24F 2221/16; F24F 2221/52; E04D 13/17; E04D 2001/309; E04B 7/18
 See application file for complete search history.

(56) References Cited

U.S. PATENT DOCUMENTS

| | | | | |
|---|---|---|---|---|
| 2,490,220 | A | * | 12/1949 | Leslie ................. E04D 13/03 454/366 |
| 2,551,965 | A | * | 5/1951 | Petersen ............... F24F 7/02 454/361 |
| 2,636,429 | A | * | 4/1953 | Parsons ................ F24F 7/02 454/366 |
| 2,692,548 | A | * | 10/1954 | Knorr .................. F24F 7/02 454/366 |
| 3,238,862 | A | * | 3/1966 | Smith .................. F24F 7/02 454/366 |
| 3,579,930 | A | * | 5/1971 | Murphy ................ E04D 13/17 52/24 |
| 3,685,426 | A | | 8/1972 | Rosa |
| 3,732,800 | A | * | 5/1973 | Goettel ................ F24F 13/08 92/42 |
| 4,334,461 | A | * | 6/1982 | Ferguson ............... F24F 7/00 285/189 |
| 4,480,534 | A | | 11/1984 | Craig |
| 4,558,637 | A | * | 12/1985 | Mason ................ E04D 1/3402 454/365 |
| 4,572,059 | A | * | 2/1986 | Ramsay ................ F24F 7/02 454/365 |
| 4,609,126 | A | | 9/1986 | Janda et al. |
| 4,672,889 | A | | 6/1987 | Lynch |
| 4,995,308 | A | * | 2/1991 | Waggoner ............. E04D 13/152 454/254 |
| 5,052,286 | A | | 10/1991 | Tubbesing et al. |
| D330,415 | S | * | 10/1992 | Thomas .................. D23/371 |
| 5,498,205 | A | | 3/1996 | Knowles et al. |
| D433,496 | S | * | 11/2000 | Hadley ................... D23/373 |
| 6,293,862 | B1 | | 9/2001 | Jafine et al. |
| 6,598,668 | B1 | | 7/2003 | Cosley et al. |
| 6,643,130 | B1 | | 11/2003 | DeMarchis et al. |
| 10,088,181 | B2 | | 10/2018 | Wilding et al. |
| 2004/0235412 | A1 | | 11/2004 | Ramsay |
| 2007/0173191 | A1 | | 7/2007 | Daniels, II et al. |
| 2014/0065946 | A1 | * | 3/2014 | Tovmasyan ............. E04D 13/17 454/358 |
| 2014/0106661 | A1 | | 4/2014 | Baldwin et al. |
| 2015/0369500 | A1 | | 12/2015 | Phillips et al. |
| 2016/0069082 | A1 | * | 3/2016 | Glick, Jr. ............. E04D 13/174 52/90.2 |
| 2017/0176029 | A1 | | 6/2017 | Wilding et al. |

FOREIGN PATENT DOCUMENTS

| | | |
|---|---|---|
| CN | 103038503 A | 4/2013 |
| EP | 1785675 | 5/2007 |
| GB | 2485469 | 5/2012 |
| JP | 60152762 | 8/1985 |
| JP | 198907322 | 5/1989 |
| JP | 05141059 | 6/1993 |
| JP | 11148693 | 6/1999 |
| JP | 2000282645 | 10/2000 |
| JP | 2005036479 | 2/2005 |
| JP | 2008002708 | 1/2008 |
| JP | 2012211739 | 11/2012 |
| JP | 2012211744 | 11/2012 |
| WO | 2011146063 | 11/2011 |
| WO | 2015087035 | 6/2015 |
| WO | 2017106200 | 6/2017 |

OTHER PUBLICATIONS

EP App. No. EP16825614.7, "Office Action," dated May 7, 2019, 4 pages.
JP App. No. JP2018-529607, "Office Action," dated Jul. 1, 2019, 6 pages.
CN20168007387 "Notice on the First Office Action" dated Nov. 5, 2019, 12 pages.
EP16825614.7 "Communication Pursuant to Article 94(3) EPC" dated Nov. 8, 2019, 4 pages.
JP2018-529607 "Decision to Grant a Patent" dated Nov. 29, 2019, 6 pages.
AU2016370485 , "Notice of Acceptance", dated Jul. 10, 2018, 3 pages.
JP2018-529607 , "Office Action", dated Dec. 10, 2018, 13 pages.
PCT/US2016/066400 , "International Preliminary Report on Patentability", dated Jun. 28, 2018, 8 pages.
U.S. Appl. No. 14/971,793 , "Corrected Notice of Allowability", dated Aug. 15, 2018, 2 pages.
U.S. Appl. No. 14/971,793 , "Final Office Action", dated Feb. 21, 2018, 12 pages.
U.S. Appl. No. 14/971,793 , "Non-Final Office Action", dated Aug. 14, 2017, 10 pages.
U.S. Appl. No. 14/971,793 , "Notice of Allowance", dated May 21, 2018, 10 pages.
U.S. Appl. No. 14/971,793 , "Restriction Requirement", dated Feb. 27, 2017, 11 pages.
chatsworth.com , "The Road to Passive Cooling Why CPI's Ducted Exhaust Cabinets are More Efficient than Alternatives", Chatsworth Products. Inc., 2009, pp. 1-6.
PCT/US2015/036406 , "International Search Report and Written Opinion", dated Sep. 18, 2015, 11 pages.
PCT/US2016/066400 , "International Search Report and Written Opinion", dated Apr. 4, 2017, 13 pages.
PG&E , "Data Center Best Practices Guide Energy efficiency solutions for high-performance data centers", Available online at http://www.pge.com/includes/docs/pdfs/mybusiness/energysavingsrebates/incentivesbyindustry/DataCenters_BestPractices.pdf, Oct. 2012, pp. 1-79.
Japanese Patent Application No. 2019-198803, Feb. 15, 2021, Office Action, 5 pages.
CN201680073872.8, Feb. 4, 2021, Office Action, 7 pages.
CN201680073872.8, Jul. 6, 2020, Office Action, 10 pages.
EP16825614.7, Feb. 11, 2021, Notice of Decision to Grant, 2 pages.
Chinese Patent Application No. 201780015996.5, May 7, 2021, Decision on Rejection, 4 pages.
Japanese Patent Application No. 2019-198803, Jun. 4, 2021, Notice of Allowance, 3 pages.
CN Patent Application No. 201680073872.8, dated Aug. 19, 2021, Decision of Reexamination, 2 pages.
CN Patent Application No. 201680073872.8, dated Sep. 1, 2021, Notice of Decision to Grant, 4 pages.

* cited by examiner

PASSIVE ROOF EXHAUSTING SYSTEM

CROSS REFERENCE TO RELATED APPLICATIONS

This application claims priority to and is a continuation of U.S. application Ser. No. 14/971,793, filed Dec. 16, 2015, issued as U.S. Pat. No. 10,088,181 on Oct. 2, 2018, and titled "PASSIVE ROOF EXHAUSTING SYSTEM," the contents of which are commonly owned and herein incorporated in its entirety.

BACKGROUND

A datacenter typically contains a collection of computer servers and components for the management, operation and connectivity of those servers, including power management components. Even in isolation, datacenter electronic components may generate sufficient heat that proactive temperature management becomes important to prolong the life of the components and ensure the smooth and continuous operation of the datacenter. When heat-generating electronic components are arranged together, the cumulative generation of heat can increase the ambient temperature and exacerbate the challenge of managing the temperature of individual components. Various structures with waste heat sources often include methods and apparatuses configured to facilitate waste heat removal from some part of the structure, such as fans, blowers, air-conditioning systems, and other powered mechanical systems.

As used herein, "datacenter" includes any facility or portion of a facility in which computer operations are carried out. A datacenter may include servers and other systems and components dedicated to specific functions (e.g., e-commerce transactions, database management) or serving multiple functions. Examples of computer operations include information processing, communications, simulations, and operational control.

Systems for exhausting warm air from a structure, such as a datacenter, include methods such as forcing environmental air through the datacenter via fans and forcing the air to exhaust outside of the structure. Such systems generally consume power and generate heat, exacerbating the already significant power draw and heat production of datacenters. However, active datacenter cooling is generally used despite these drawbacks, due to the fact that high temperatures significantly shorten the life of numerous types of electronic components. Finally, thermal exhaust systems generally require both modification to the structure housing the datacenter and powered mechanical systems to function, and therefore require a significant initial outlay of cost associated with building a datacenter or renovating a structure for such use.

BRIEF DESCRIPTION OF THE DRAWINGS

Various embodiments in accordance with the present disclosure will be described with reference to the drawings, in which.

DETAILED DESCRIPTION

Figure 1:
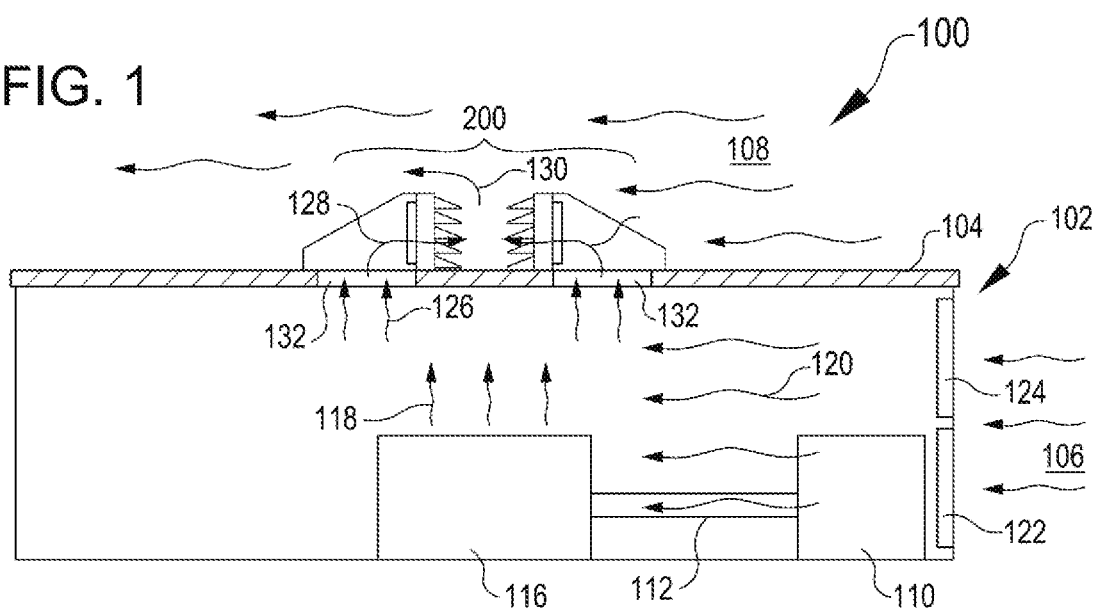
FIG. 1 is a side view schematic illustrating a first example system for passively exhausting warm air from a structure, in accordance with various embodiments.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Techniques described herein include passive systems and devices for enabling the passive exhaust of warm air from a datacenter. At least some embodiments herein are particularly directed to flat-roofed structures, which are efficient and inexpensive to build. Further embodiments can be used with structures having non-flat roofs (e.g., sloped roofs, curved roofs). By way of example, and as described in further detail below, a datacenter can generate a significant quantity of heat, which can be removed by taking in a cool flow of air from the environment and exhausting a hot flow of air from the datacenter. To that end, a datacenter can be modified to passively exhaust this flow of air by cutting voids in a flat rooftop surface of the structure containing the datacenter and installing an array of exhaust modules at the voids. Generally speaking, as used herein "passively" exhausting air refers to moving air through the voids without the use of air-moving equipment (e.g., fans, blowers, air-conditioning systems, and other powered mechanical systems) at or near the voids. Each module of the array can be configured to receive an upward flowing exhaust flow of air from the structure via an intake surface, and exhaust the flow of air from a sideways-oriented exhaust surface. The intake surface can join with the roof; the exhaust surface can be located at a side surface of each module, such that the module exhausts sideways; and a closed surface at the top of each module can direct airflow in the module from the intake to the exhaust. The closed surface can also direct exterior airflow over the module like a ramp from a low side of the closed surface to a high side.

By way of further example, each module can be paired with a second module, and with the two modules of each pair facing one another (i.e., the exhaust surfaces facing one another). In this configuration, exterior airflow passing along an axis perpendicular to the exhaust faces can pass up along the closed surface of one of the modules, pass over the intermediate space between the modules, entraining rising exhaust air exiting from the modules in the exterior flow, and then pass down along the closed surface of the second of the modules. This configuration can significantly mitigate the possibility of external airflow directly impacting the exhaust face of any one module, and thereby can substantially mitigate the possibility of reversed flow in the exhaust system. This configuration may also productively employ Bernoulli's principle to create a low-pressure region that further draws the exhaust flow from the structure containing the datacenter. In some embodiments, the paired configuration can be expanded into an array of parallel pairs of modules, which can run along a line perpendicular to a direction of the prevailing wind, in order to better employ this effect. Other orientations relative to the direction of the prevailing wind can also be used.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

FIG. 1 illustrates an example of a passive exhaust system 100 of a structure 102, in accordance with various embodiments. In some embodiments, the structure 102 can be a datacenter, or any other facility that generates a significant quantity of heat and that requires convective cooling. In various embodiments, the structure 102 receives a first flow of air 106 from the environment. In some cases, the flow of air 106 can be received at an intake region, shown at the right side of the structure 102 of FIG. 1. In particular embodiments, the air 106 can be diverted via a ventilation system. For example, a first intake region 122 connected with an air intake 110 diverts the flow of air 106 via a ventilation system 112 to an enclosed portion 116 of the structure 102. In some other embodiments, the air 106 can flow passively into the structure. For example, the structure 102 can receive the first flow of air 106 at a second intake region 124 that admits air from the flow of air 106 into the structure directly. In alternative embodiments, cool ambient air can be received in the structure 102 via any suitable intake, such as at a side of the structure 102, below the structure 102, or via ducts from outside the structure. In any event, the first flow of air 106 enters the structure 102 and provides an interior flow of air 120 that can capture waste heat from components within the structure, such as various datacenter components and other electronic or mechanical devices, such as servers, network hardware, switching hardware, logistics hardware and equipment, or other suitable heat-generating equipment within the structure 102. In some embodiments, the structure 102 can include an enclosed portion 116 at a higher temperature than the rest of the structure 102, such as a "hot aisle," configured to capture waste heat that flows through or past components that generate heat, and particularly when the waste heat flows in one direction from a cool region to the exhaust enclosure. The enclosed portion 116 may generate a significant flow of warm air 118 which in some embodiments can be directed, e.g. via ducts (not shown), toward voids 132 in the roof 104 of the structure 102. In alternative embodiments, various additional features internal to the structure 102 (not shown) may be used for segregating warm exhaust air from cool air and for directing warm exhaust air upward, such as ducts, partitions, hot and cold aisles, and similar features.

In various embodiments, the structure 102 can exhaust flows of warm air 126 from the structure via voids 132 in the roof 104. A passive exhaust array 200 can be connected with the voids 132 in order to receive the exhaust flows 126, divert the exhaust flows sideways as shown by the arrows 128, and entrain the diverted exhaust flows in a second environmental flow of air 108 that bypasses the structure 102. In some embodiments, as described in more detail below (see FIG. 2), second environmental flow of air 108 passes over the roof 104 of the structure, passing up a wedge-shaped part of the exhaust array 200, across the exhaust array, and down the opposite side of the array. The passive exhaust array 200 thus produces a Venturi effect, further drawing air from within the passive exhaust array 200. Additionally, by diverting the second environmental flow of air 108, the exhaust array 200 can locally increase the speed of the flow of air 108 in order to take advantage of Bernoulli's principle by locally reducing the air pressure above the passive exhaust array 200.

Figure 2:
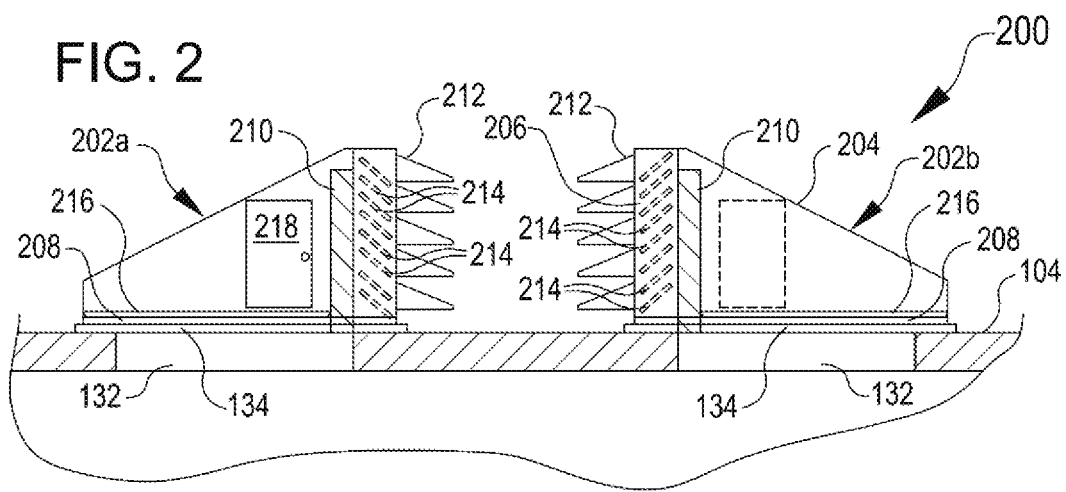
FIG. 2 is a side view schematic illustrating elements of the passive exhausting system of FIG. 1, in accordance with various embodiments.

FIG. 2 illustrates elements of the passive exhaust system 200 of FIG. 1 in greater detail, in accordance with various embodiments. The passive exhaust system 200 includes at least a pair of modules 202a, 202b (cumulatively 202). The modules 202a and 202b can, in some embodiments, be identical; but in various other embodiments can be symmetrical or similar. An exhaust module 202 can be configured to receive an exhaust stream through a void 132 in the roof 104, and can exhaust the exhaust stream through an exhaust face 206. For example, in particular embodiments, the modules 202 can include a sloped face 204, exhaust face 206 which can be open for exhausting the exhaust stream, and an intake face 208 at the bottom of the module for receiving the exhaust flow from voids 132 in the roof. In some cases, the modules 202 can be installed to curbs 134 raised on the surface of the roof around the voids 132, which may be built in to the structure, or may be added. Curbs 132 can be any suitable material, such as a structural material of the building (e.g. cement, steel, aluminum, high-strength polymer, etc.), and may be bolted or similarly attached to the roof 104. In some cases, the curb 134 can be, for example, a steel C-channel beam attached (e.g., bolted) vertically with the roof 104. In some cases, a curb 134 can include waterproofing features, such as a mortar, rubber gasket, caulk, or other structures or materials that provide waterproofing functions. The intake face 208 can include additional connective features, such as an additional C-channel and one or more Z-beams, possibly including one or more Z-beams that connect (at a high side) to the interior of the module 202 and overhang a portion of the curb 134 projecting away from the module 202 and over the curb 134, so as to direct water away from the void 132.

In some embodiments, a module 202 can include one or more features for preventing the intrusion of dust or water from the exhaust face 206. For example, a module 202 can include filters 210, which can be coarse filters, located interior to the module 202 and across the exhaust face 206 (as shown), across the intake face 208 (not shown), or a combination of both. In embodiments, a module 202 can include a hood 212, which extends away from the exhaust face 206 and slopes downward away from the module; and in some cases a module 202 can include multiple hoods. In any event, a topmost hood 206 can project from a top portion of the exhaust face 206 such that an airflow encountering the top portion of the exhaust face 206 can be directed up and over the module 202 by the topmost hood 206. Any or all of the hoods 206 can also act to shield the exhaust face 206 from rain and/or debris.

In some embodiments, a module 202 can include elements for modifying the exhaust flow. For example, a module 202 can also include a baffle assembly 214, which can include active and/or passive baffles. In some embodiments, the baffle assembly 214 can be manually locked in order to obstruct airflow, which may be desirable during construction or events that may promote backdraft or debris, such as wind and rain storms. In some embodiments, the baffle assembly 214 may include baffles that are balanced, e.g. via a counterweight or spring, to promote airflow out of the module 202 while closing if the direction of the exhaust flow changes to flowing into the module 202.

In some embodiments, a module 202 can also have features for mitigating water intrusion and/or mitigating condensation. For example, a module 202 can include a catchment assembly 216, which can include one or more gutters and/or catchments connected with the interior surfaces of the module 202, for example near the intake face 208. The catchment assembly 216 can receive a flow of condensation along the interior surfaces and direct the flow to an outlet, such as a pipe or second gutter, so as to prevent the condensation from dripping uncontrolled through the voids 132. In some embodiments, the module 202 can also include an insulating layer 320, such as a surface layer and/or an additional layer of an insulating material along some or all of the interior surfaces (see, e.g. FIG. 3). The insulating layer may act to help prevent condensation from forming inside the module 202 by insulating the warm exhaust air from the colder surfaces of the module 202. In further embodiments, a module 202 can also include access means, such as an access hatch 218 in a surface of the module 202. In some cases, the access hatch 218 can be on a side surface of the module 202, but in alternative embodiments, the access hatch can include, for example, some or all of the exhaust face 206 being capable of swinging out on a hinged assembly. In any event, the access hatch can also be arranged to be locked or secured against unauthorized access.

Figure 3:
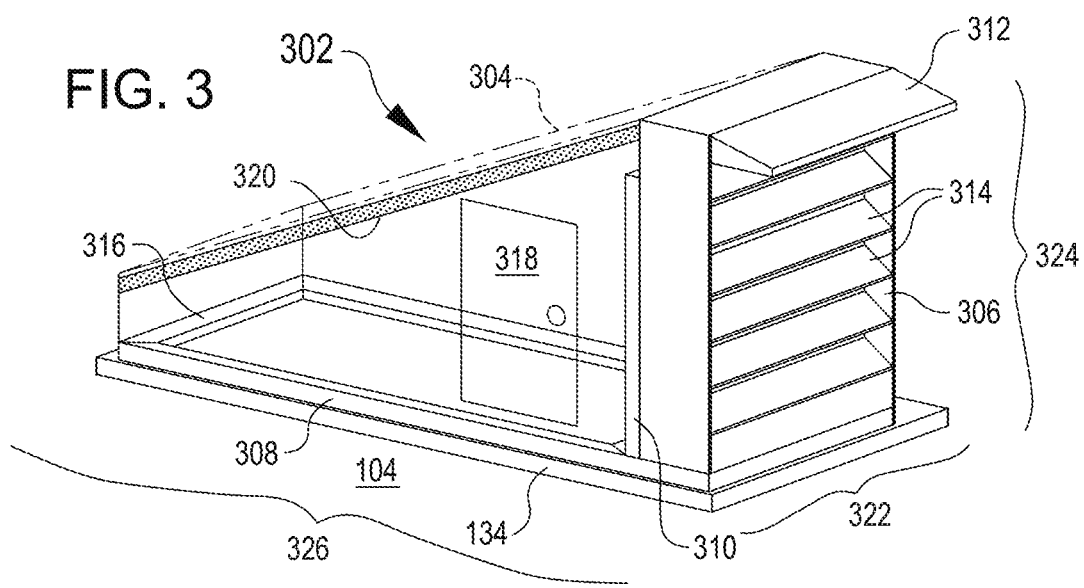
FIG. 3 is a perspective view schematic illustrating an element of the passive exhausting system of FIG. 1, in accordance with various embodiments.

FIG. 3 is a perspective view schematic illustrating another example of a module 302 configured for use with a passive exhausting system such as the system of FIG. 1, in accordance with some embodiments. The module 302 can include a sloped surface 304 for directing airflow over the module. In various embodiments, the sloped surface 304 can also be curved, for example by following an arc from the intake face 308 to the exhaust face 306. In some alternative embodiments, the module 302 can be substantially curved or bowed from the intake face 308 to the exhaust face 308.

In further embodiments, the module 302 can include elements for directing an airflow directed against the exhaust face 306. For example, the module 302 can include a single hood 312, which can act as an aerodynamic structure for directing ambient airflow over the module 302. When airflow is coming over the module 302 from the sloped surface 304, the hood 312 can mitigate eddy formation to mitigate the possibility of backdraft into the exhaust face 306. When airflow is coming toward the exhaust face 306, e.g. from the top of a second module (not shown), the hood 312 can redirect the airflow over the module 302.

In some embodiments, the module 302 can also include elements for protecting the interior of the module from condensation, weather, and debris. For example, the module 302 can include passive baffles 314, which can slope downward in the direction away from the exhaust face, so as to direct debris and/or water away from the interior of the module 302. A filter element 310 can also be arranged proximate to the exhaust face 306 for preventing debris, such as dust or water droplets, from entering the module 302. In accordance with some embodiments, a condensation catchment 316 is shown around an interior perimeter of the module 302, and an insulation layer 320 is shown abutting the interior surface of the module 302. In some embodiments, interior components of the module 302 can be accessed via an access hatch 318. The intake face 308 is connected with a curb 134 of the roof 104.

In some embodiments, various specific dimensions of an exhaust module 302 are possible in order to enable usefully rapid passive exhaust. For example, in some specific embodiments, dimensions of an exhaust module can be approximately 10 feet wide (dimension 322) and 10 feet high (dimension 324) at the exhaust face and the sloped face 304 can extend back approximately 15 feet in length (dimension 326). Various other dimensions are possible within a broad range of module sizes. For example the exhaust face 306 may vary in width and height 322, 324, from a few feet to 20 feet or more; and similarly, the length 326 can vary from a few feet to 30 feet or more.

Figure 4:
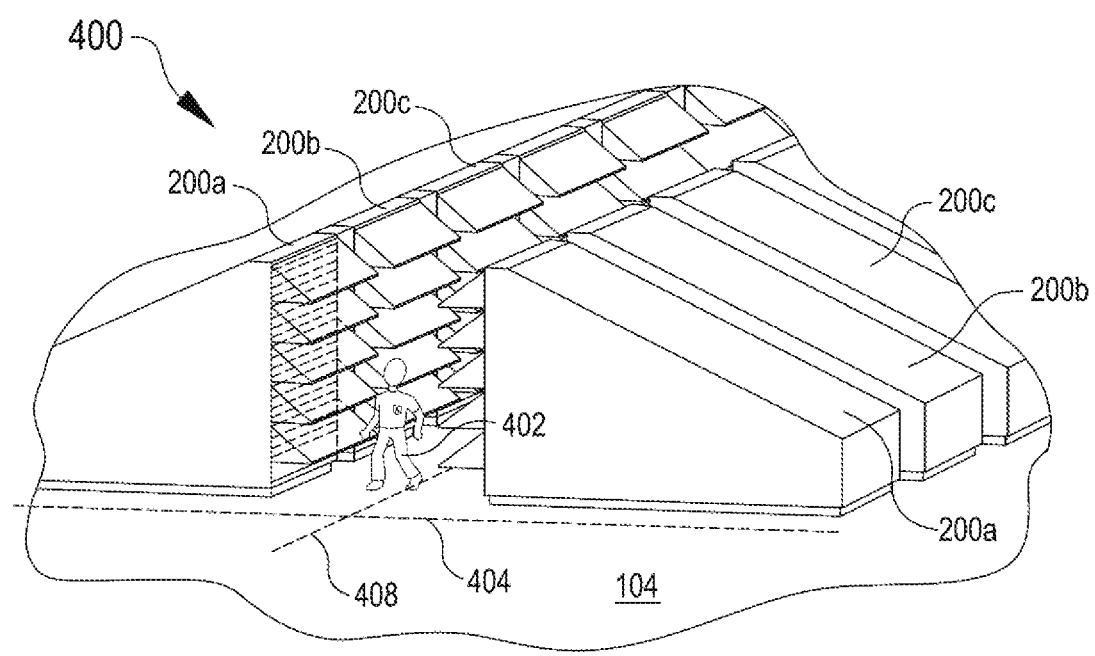
FIG. 4 is a perspective view illustrating an array of elements of the passive exhausting system of FIG. 1, in accordance with various embodiments.

FIG. 4 is a perspective view illustrating an array 400 of module pairs 200 of the passive exhausting system of FIG. 1, in accordance with some embodiments. In particular embodiments, the array 400 can include multiple pairs (200a, 200b, 200c, or cumulatively 200) of modules, such as the modules 202 or 302 (FIGS. 2-3) positioned on a roof 104, e.g. a roof of a structure such as a building containing a datacenter. The module pairs 200 of the array can be arranged to interact with an ambient flow of air. For example, the module pairs 200 can be arranged in parallel with a first axis 404 of the array 400, and in some cases the first axis 404 can be aligned with a direction of the ambient flow of air, such as an environmental flow or the prevailing wind; and a second axis 408, which can be perpendicular to the first axis 404, can be aligned with a long dimension of the array 400. In some cases, the second axis 408 may be at an angle to the first axis 404, such that the module pairs 200, while individually parallel with the first axis, may be offset from one another in order to accommodate, for example, roof 104 that is oriented at an angle to the prevailing wind. In various embodiments, the module pairs 200 are spaced such that a technician 402 can access each module of the module pairs 200.

Figure 5:
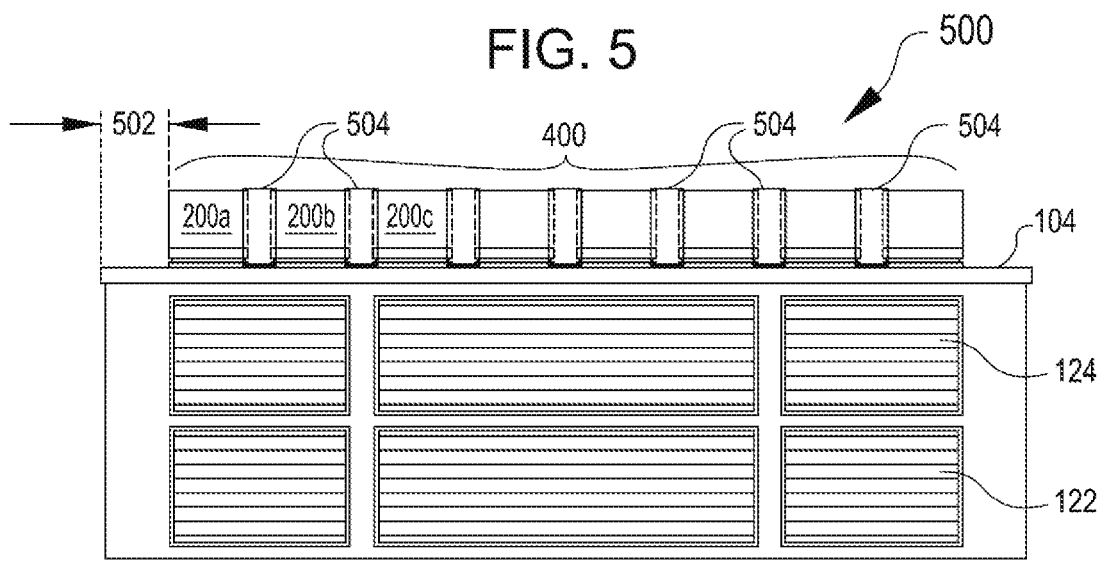
FIG. 5 is a front view schematic illustrating another example system for passively exhausting warm air from a structure, in accordance with various embodiments.

FIG. 5 is a front view schematic illustrating a second example of a passive exhaust system 500, similar to example system 100 of FIG. 1, in accordance with some embodiments. The example system 500 includes a roof 104 and intakes 122, 124, similar to the example system 100 of FIG. 1. In some embodiments, an array 400 of modules 200a, 200b, 200c (cumulatively 200) can be arranged on the roof 104, with a spacing 502 between an edge of the roof 104 and the array 400. In some embodiments, interspersed between modules 200 in the array 400, panels 504 can be arranged for directing an environmental flow of air over the array 400. In some alternative embodiments, the modules 200 can be assembled abutting one another, and may or may not include intervening panels.

Figure 6:
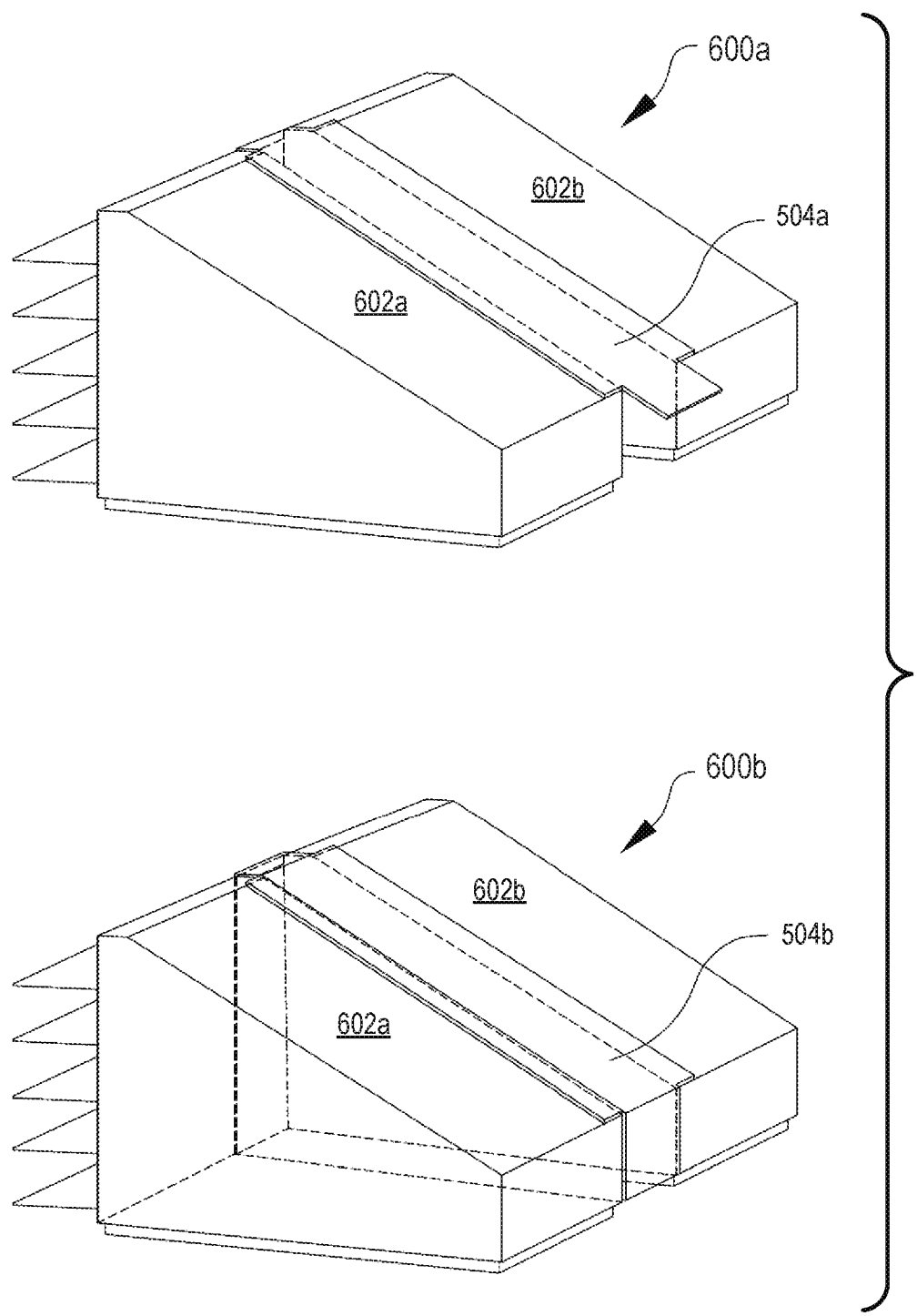
FIG. 6 is a perspective view illustrating aerodynamic aspects of elements of a passive exhausting system, such as the systems shown in FIGS. 1 and 5, in accordance with various embodiments.

FIG. 6 is a perspective view illustrating aerodynamic aspects of connected module assemblies 600a, 600b (cumulatively 600) of a passive exhausting system, such as the systems 100 and 500 shown in FIGS. 1 and 5, in accordance with particular embodiments. Two modules 602a, 602b (cumulatively 602) can be arranged in parallel with a panel assembly 504a, 504b arranged between the modules for directing air over the module assembly 600. For example module assembly 600a includes a substantially straight panel assembly 504a partially overlapping and connected with each of the modules 602a, 602b. In some embodiments, the module assembly can be shaped. For example, module assembly 600b includes a bent or curved panel 504b partially overlapping and connected with each of the modules 602a, 602b and wrapping partially around the modules. In embodiments, various other degrees of coverage are possible between adjacent modules, such as modules in an array.

Figure 7:
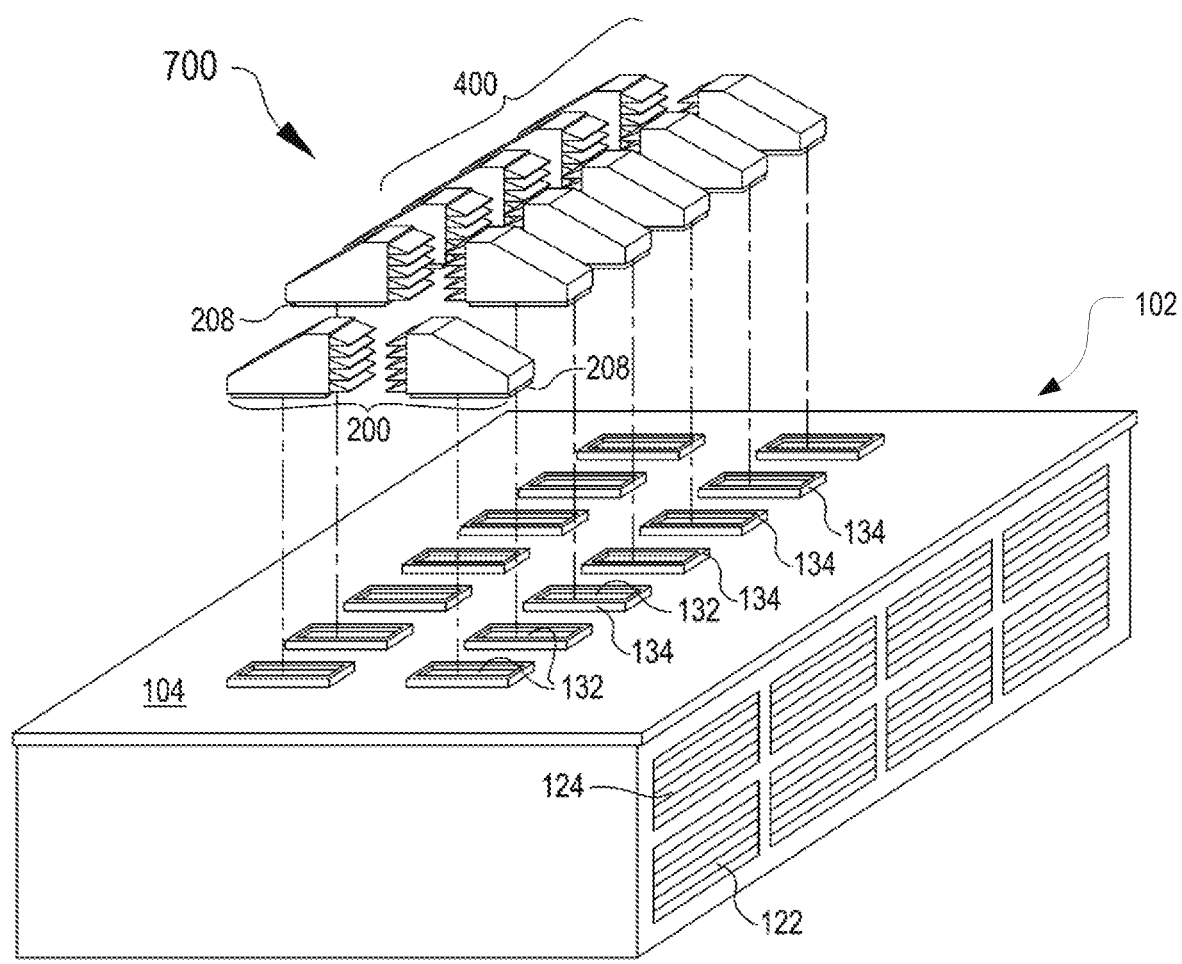
FIG. 7 is a perspective view illustrating a system for assembling a modular system for passively exhausting warm air from a structure, such as the system shown in FIG. 1, in accordance with various embodiments.

FIG. 7 is a perspective view illustrating a system 700 for assembling a modular passive exhaust system for exhausting warm air from a structure, in accordance with embodiments. In the system 700, a structure 102, such as a building containing a datacenter, is configured to draw in cool air from the environment (e.g. at intakes 122, 124) and exhaust hot air back into the environment (e.g. via exhaust modules 200). For example, the structure can include air intakes 122, 124; a roof 104, and voids 132 in the roof 134. In some cases, the voids 132 can be built into the structure during initial construction, and may be covered prior to use. In some cases, the voids 132 can be formed at a time after the roof 104 has been assembled, such as near in time to a rollout of a datacenter at the structure 102. In some embodiments, curbs 134 can also be formed around the voids 132, and configured for providing a connection surface for modules 200 of the passive exhaust array 400, and for preventing the intrusion of water or debris from the roof 104 into the structure 102. In some embodiments, the modules 200 can be assembled prior to connection with the roof 104, and then lowered onto the curbs 134, such that the intake face 208 of each module 200 connects (e.g. via bolts or screws) with a curb 134 of the roof 104. In some embodiments, additional waterproofing features can be provided where the modules 200 connect with the curbs 134. The array 400 can be assembled at one time, or can be gradually assembled onto the roof 104 as a need for exhausting warm air from the structure 102 changes over time, e.g. with the addition of further heat-producing components into the structure 102.

Figure 8:
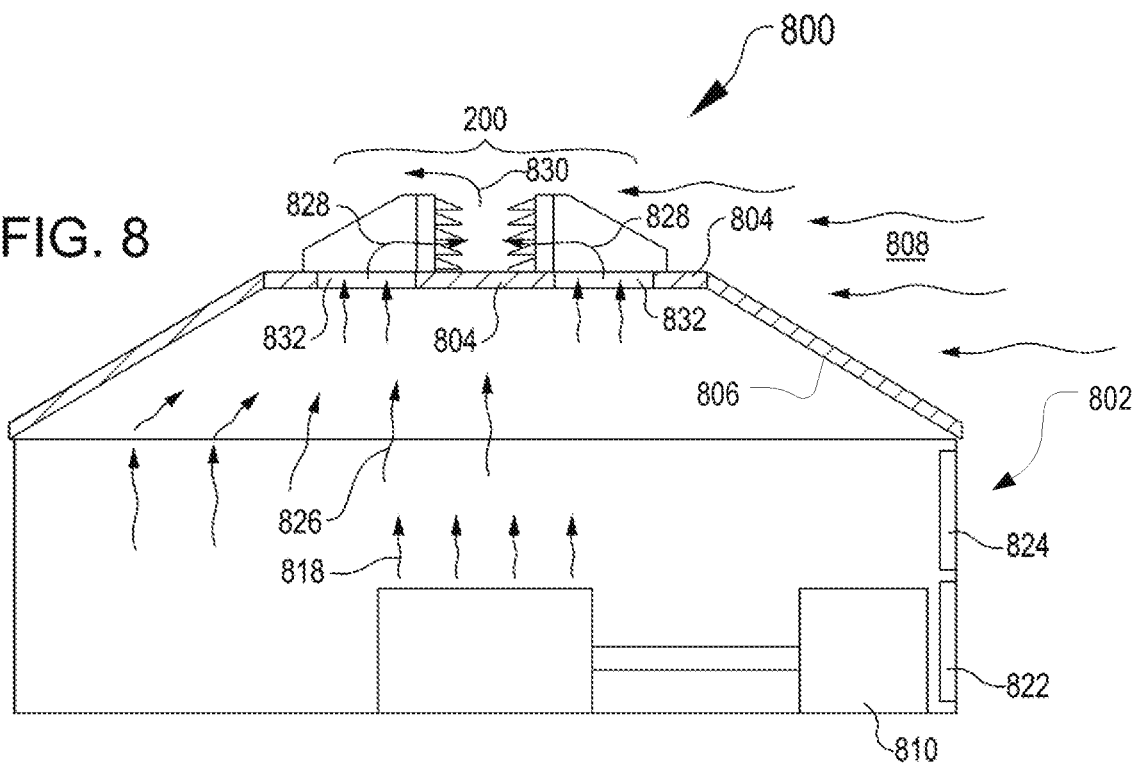
FIG. 8 is a side view schematic illustrating a second example system for passively exhausting warm air from a structure, in accordance with various embodiments.

FIG. 8 is a side view schematic illustrating another example system 800 for passively exhausting warm air from a structure 802 having both flat and sloped roof portions 804, 806, in accordance with embodiments. The structure 802 can be a datacenter, can include a datacenter therein, or can include any other facility that generates a significant quantity of heat and that requires convective cooling. In some embodiments, the system 800 includes the structure 802 having intake vents 822, 824; interior airflow management structures such as an intake element 810; a flat roof portion 104; and sloped roof portions 806. In many embodiments, hot air 818 can rise from interior airflow management structures, and can join interior airflow 826 which can be directed and concentrated toward the flat roof portion 104 by the sloped roof sections 806, such that the interior airflow 826 exits the structure 802 via voids 832 in the flat roof portion 804. Similar to the system 100 shown in FIG. 1, the interior airflow 826 can be diverted 828 through the exhaust modules 200, and can be entrained as exhaust airflow 830 by the exterior airflow 808 as the exhaust airflow 830 exits the structure 802.

Figure 9:
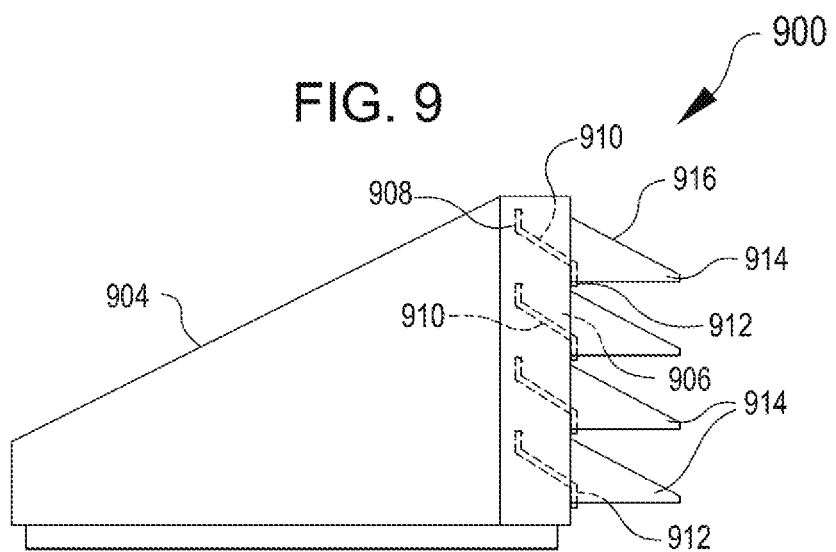
FIG. 9 is a side view schematic illustrating weather-resistant aspects of an element of a system for passively exhausting warm air from a structure.

FIG. 9 is a side view schematic illustrating a module 900 having weather-resistant aspects for use in a system for passively exhausting warm air from a structure, such as systems 100, 500, or 800 (FIGS. 1, 5, 8), in accordance with different embodiments. The module 900 can include a sloped surface 904 and an exhaust face 906. In some embodiments, a series of baffles 910 can be connected with the exhaust face 906 for capturing debris or water that may be blown into the exhaust face 906. In some embodiments, the baffles 910 can be sloped downward away from the exhaust face 906, and can further include vertical portions 908, 912 at the upper and lower parts of the baffles 910. In some embodiments, one or more hoods 914 can also be assembled with the exhaust face 906 and project outward and downward away from the exhaust face, so that an upper surface 916 of each hood can divert water away from the exhaust face.

Figure 10:
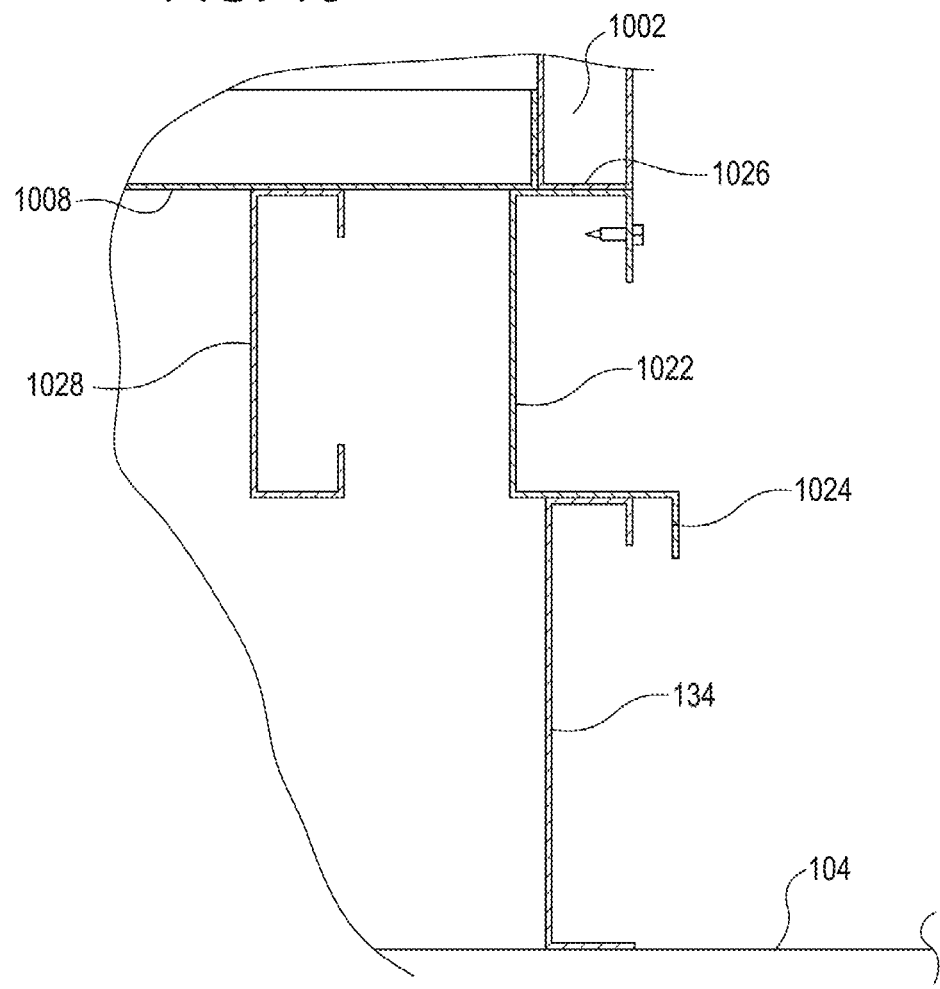
FIG. 10 is a side view schematic illustrating a connection between a module for use in a passive exhaust system and a roof.

FIG. 10 is a side view schematic illustrating an example system 1000 for connecting an exhaust module 1002 for use in a passive exhaust system with a roof 104, in accordance with various embodiments. In some embodiments, the system 1000 is configured to connect an exhaust module 1002 with a roof 104 via a curb 134, and to prevent the intrusion of water into the interior of the module 1002. In some embodiments, a curb 134 can be installed to a roof 104, e.g. via connectors such as screws, bolts, a mortar or caulk, cement, and/or other suitable means of connecting. In some cases, the curb 134 can be a structural C-beam, and can be connected with the roof 104 via any suitable combination of the above connecting means, such as via a watertight seal using a caulk, cement, or gasket in addition to being bolted to the roof. In some embodiments, an intake face 1008 of an exhaust module 1002 can be supported internally, e.g. via interior structural beams 1028, and can be supported at the curb via external structural beams 1022, which can include a structural, vertical portion 1022 and an overhang 1024 for preventing the intrusion of water between the curb 134 and external structural beams 1022. In some embodiments, a connection between the exhaust module 1002 and the external structural beams 1022 can include an intermediate Z-beam 1026 which overhangs the external structural beam 1022 in order to prevent the intrusion of water between the exhaust module 1022 and the external structural beams 1022. In various alternative embodiments, different configurations of the above components may be possible. For example, an exhaust module 1002 may be assembled with the curb 134 absent an intervening external structural beam 1022, such that the z-beam 1026 overhangs the curb 134.

Figure 11:
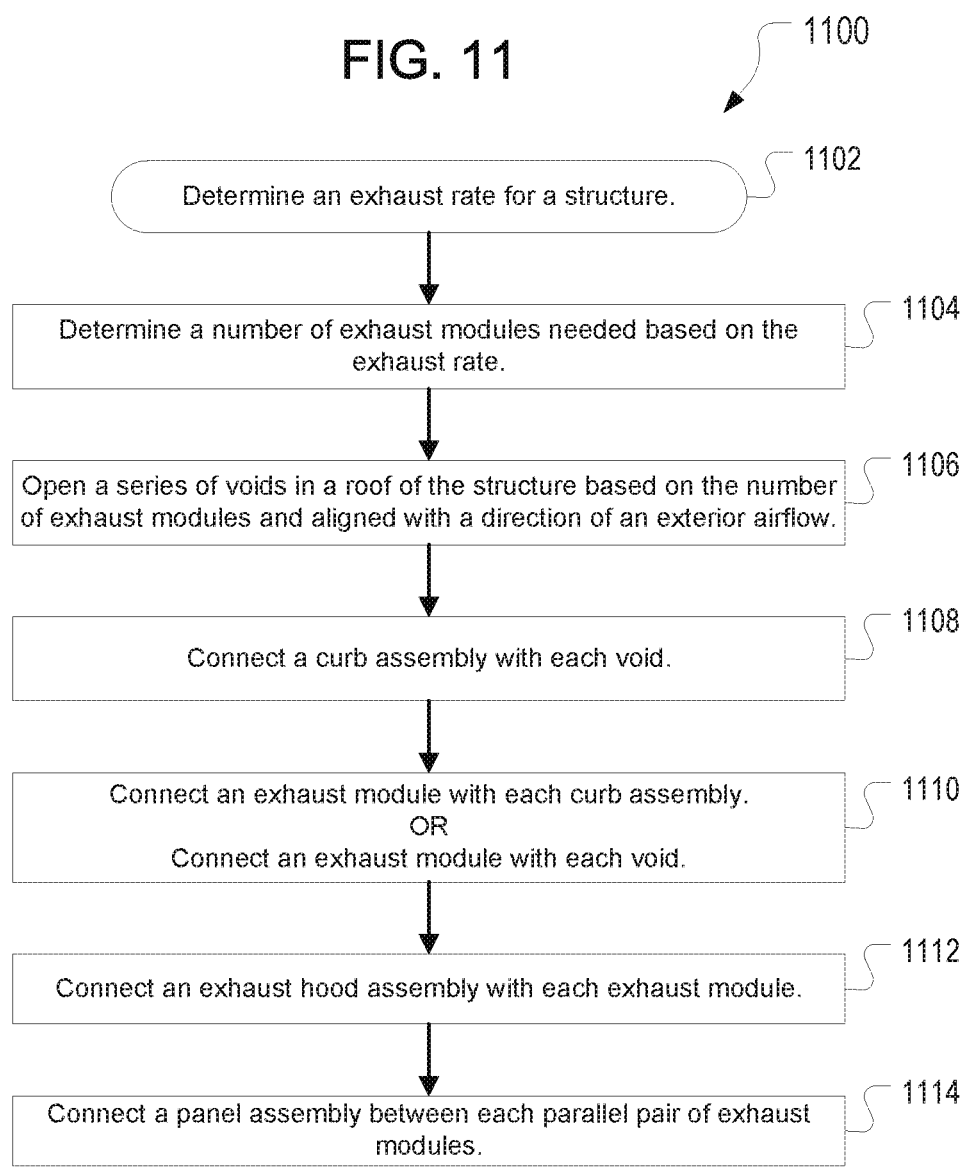
FIG. 11 illustrates an example process for assembling a system for passively exhausting warm air from a structure.

FIG. 11 illustrates an example process 1100 for assembling a system for passively exhausting warm air from a structure, in accordance with embodiments. Steps shown in the example process 1100 can be implemented in accordance with systems for assembling a passive exhaust system with a roof of a structure, for example as shown in system 700 of FIG. 7. In some embodiments, an exhaust rate need of a structure can be determined (act 1102), e.g. by determining a rate of heat production in the structure, such as by heat-generating components of a datacenter. A number of exhaust modules needed for achieving the desired exhaust rate can be determined based on, for example, modeling and/or empirical data, which may include assessing attributes of the environmental airflow around the structure such as peak and minimum wind speed and direction, the temperature around the structure, and the convective properties and internal geometry of the structure (act 1104). Next, a series of voids can be opened in the roof of the structure based on the desired number of exhaust modules (act 1106). In some cases, the voids may be preinstalled in the roof of the structure based on a predicted need, and may be covered prior to use. In some cases, the voids may by aligned with the direction of an environmental airflow such as the prevailing wind; and in some cases the voids may be aligned in two rows, with the rows running in a direction different than direction of the alignment with the environmental airflow. In some embodiments, the voids may be aligned in more than two rows. Next, a curb assembly can be connected with or around each void (act 1108), and configured for receiving an exhaust module. In some embodiments, exhaust modules include curbs, or exhaust modules may be installed directly to the roof without an intervening curb. Next, each exhaust module can be connected with a curb assembly of the installed curb assemblies (act 1110), or alternatively, can be connected with a void of the series of voids, in order to form an array of exhaust modules. In some embodiments, the exhaust modules can be assembled prior to assembly with the curb assemblies; or can be prefabricated in a series of parts that can be assembled together and with the curb assemblies in the same process. In some embodiments, the exhaust modules can be prefabricated offsite and transported to the structure in a fully assembled, mostly assembled, or partly assembled state.

Additional features can be added to the assembled array of exhaust modules. For example, an exhaust hood assembly can be connected with each exhaust module (act 1112); and a panel assembly can be connected between each adjacent pair of exhaust modules in each row of the assembly (act 1114). Furthermore, in some embodiments, a structure already possessing features of a passive exhaust system can be revised to include additional exhaust modules.

Figure 12:
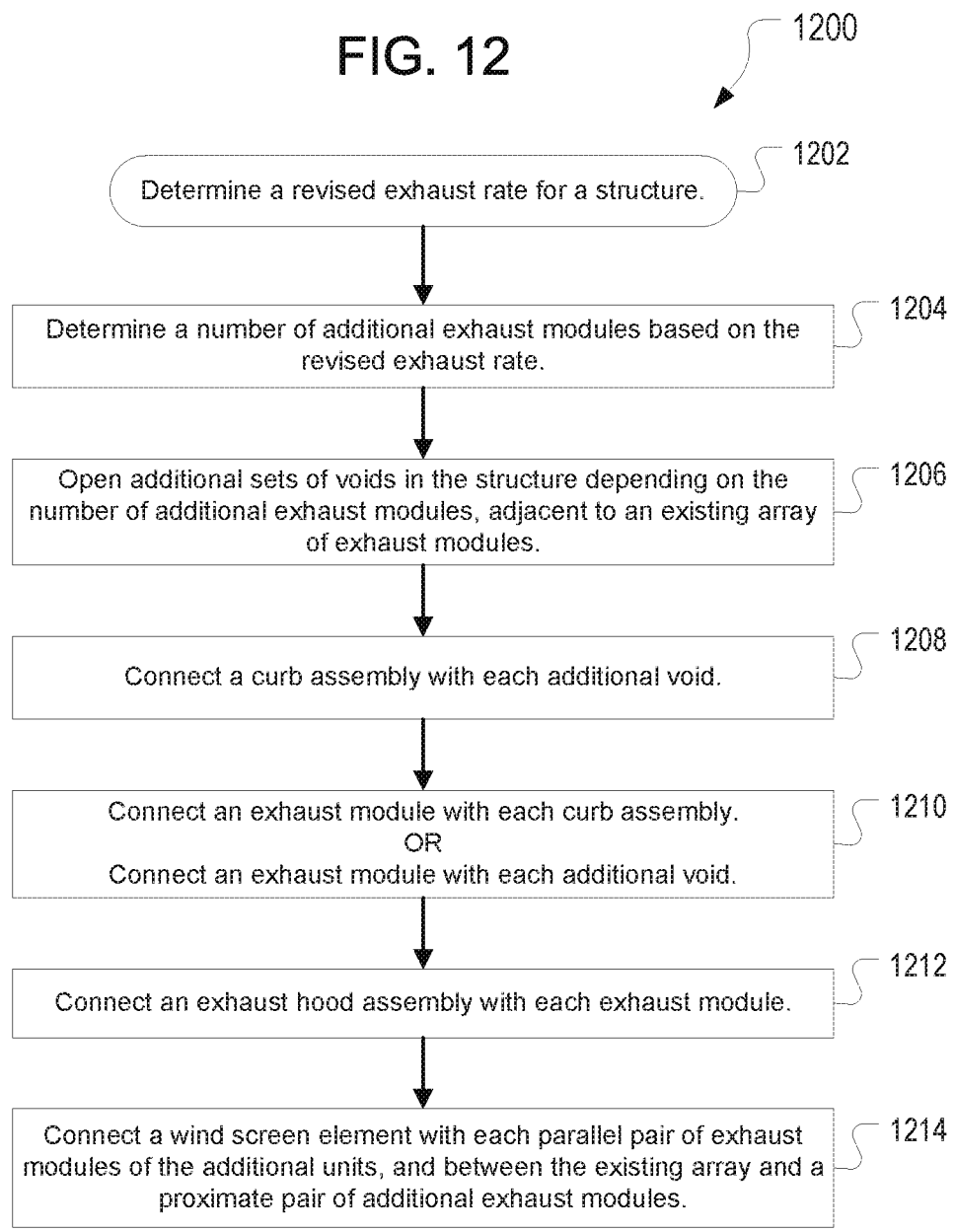
FIG. 12 illustrates an example process for revising a system for passively exhausting warm air from a structure.

FIG. 12 illustrates an example process for revising a system for passively exhausting warm air from a structure. Steps shown in the example process 1100 can be implemented in accordance with systems for assembling a passive exhaust system with a roof of a structure, for example as shown in system 700 of FIG. 7. For example, in embodiments, a revised rate of exhaust needed for a structure, such as a datacenter, can be determined (act 1202) based on, for example, a known or projected increase in a needed throughput of air for cooling the interior of the structure. For example, an increased need may come about when a datacenter is expanded to include additional components, or when an existing datacenter is renovated to decrease the use of powered exhaust and increase the use of passive exhaust. A number of additional exhaust modules needed to achieve a targeted exhaust rate can be determined above in act 1104 (FIG. 11) (act 1204), and then voids or additional sets of voids can be opened in the roof of the structure (act 1206), which can include siting the voids parallel to existing exhaust modules or an existing array of exhaust modules, possibly aligned with a direction of an external airflow. Next, a curb assembly can be connected with each additional void (act 1208) configured for receiving and connecting with an exhaust module. An exhaust module can be connected with each curb assembly, or in the case that exhaust modules can connect with the roof directly can be connected with the roof at each additional void (act 1210). As described above, additional features can be added to the assembled exhaust modules. For example, an exhaust hood assembly can be connected with each exhaust module (act 1212); and a panel assembly can be connected between adjacent pairs of exhaust modules (act 1214).

The modular nature of the exhaust modules can permit the rapid deployment of the above-described passive exhaust systems to structures such as datacenters, and can be assembled with structures without significantly impacting the architecture or interior workings thereof. Accordingly, arrays of exhaust modules can be constructed at structures immediately prior to the deployment of heat-generating components at those structures, which reduces an initial outlay of expense when constructing new buildings; and exhaust modules can be assembled with many preexisting structures, thus decreasing the cost of renovating a building for accommodating high exhaust need. Furthermore, exhaust modules can be installed in any suitable number of arrays, e.g., multiple rows of exhaust modules can be installed on a roof with sufficient space.

Figure 13:
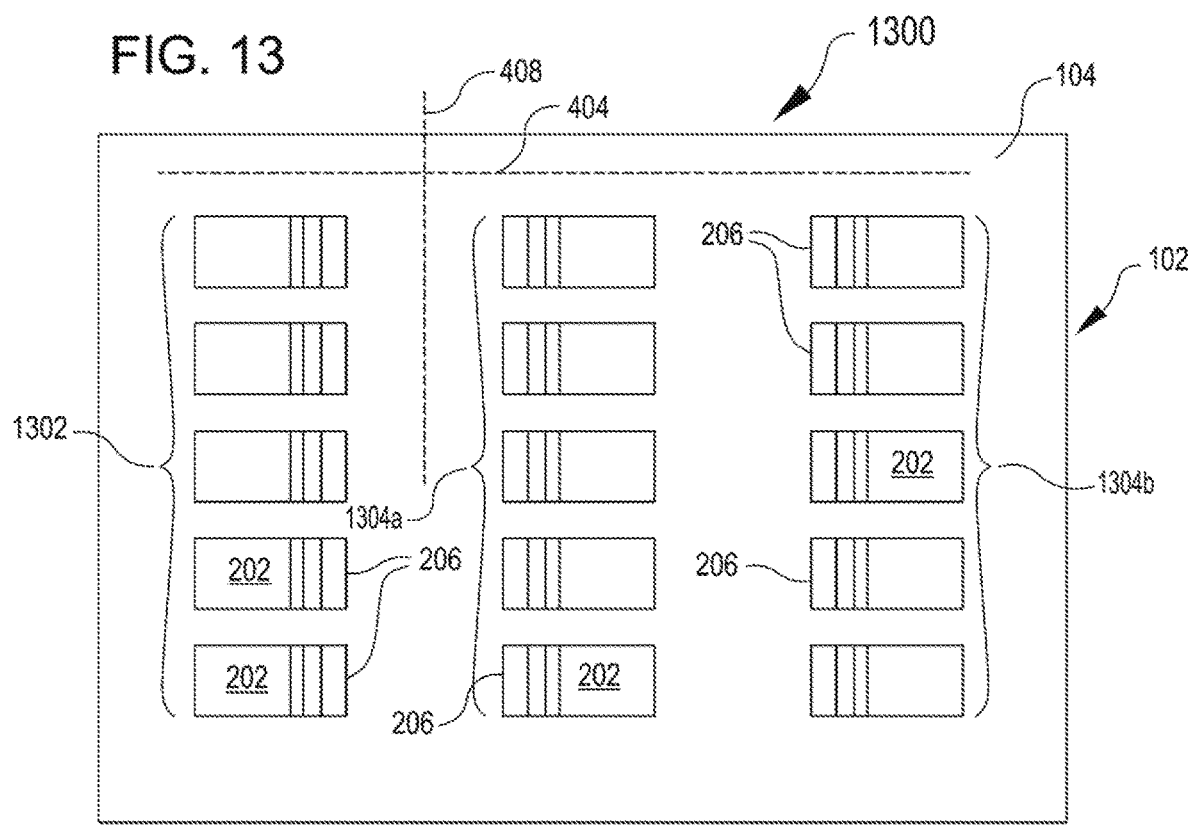
FIG. 13 is a top view schematic illustrating another example system for passively exhausting warm air from a structure, in accordance with various embodiments.

For example, FIG. 13 is a top view schematic illustrating an example of a passive exhaust system 1300 having multiple rows 1302, 1304*a*, 1304*b* of modules 202 arrayed on a roof 104 of a structure 102, in accordance with some embodiments. In the system 1300, a structure 102 with a flat roof 104 can have mounted thereon a first row 1302 of modules 202. Each module of the first row 1302 can face in the same direction. For example, each module 202 of the first row can be oriented such that an exhaust face 206 of the module is aligned with a first axis 404. In some embodiments, additional rows 1304*a*, 1304*b* of modules 202 may be arranged on the roof, also aligned with the first axis 404 but facing the opposite direction of the first row 1302. For example, the modules 202 of the additional rows 1304*a*, 1304*b* may be oriented with the exhaust faces 206 facing and opposing the exhaust faces of modules of the first row 1302. Any number of rows may be arrayed in parallel with and in the same orientation as each other, similar to the additional rows 1304*a*, 1304*b*, in a saw-tooth configuration (e.g., with multiple adjacent rows of modules in the same orientation). In some cases, the first row 1302 and the additional rows 1304*a*, 1304*b* may extend, arrayed along a second axis 408. The first axis 404 may be aligned in parallel with a direction of an exterior flow of wind, or in another direction relative to the exterior flow of wind. In some embodiments, further additional rows of modules may be provided in any suitable number and arrayed in parallel, and in the same orientation as, either of the first row 1302 and the additional rows 1304*a*, 1304*b*. The rows may be aligned with respect to the environment such that the exhaust faces 206 of modules 202 in the first row 1302 face toward a direction of the prevailing wind. In some cases, the additional rows 1304*a*, 1304*b* may be aligned so that exhaust faces 206 of modules 202 in the additional rows 1304*a*, 1304*b* face toward the prevailing wind.

Figure 14:
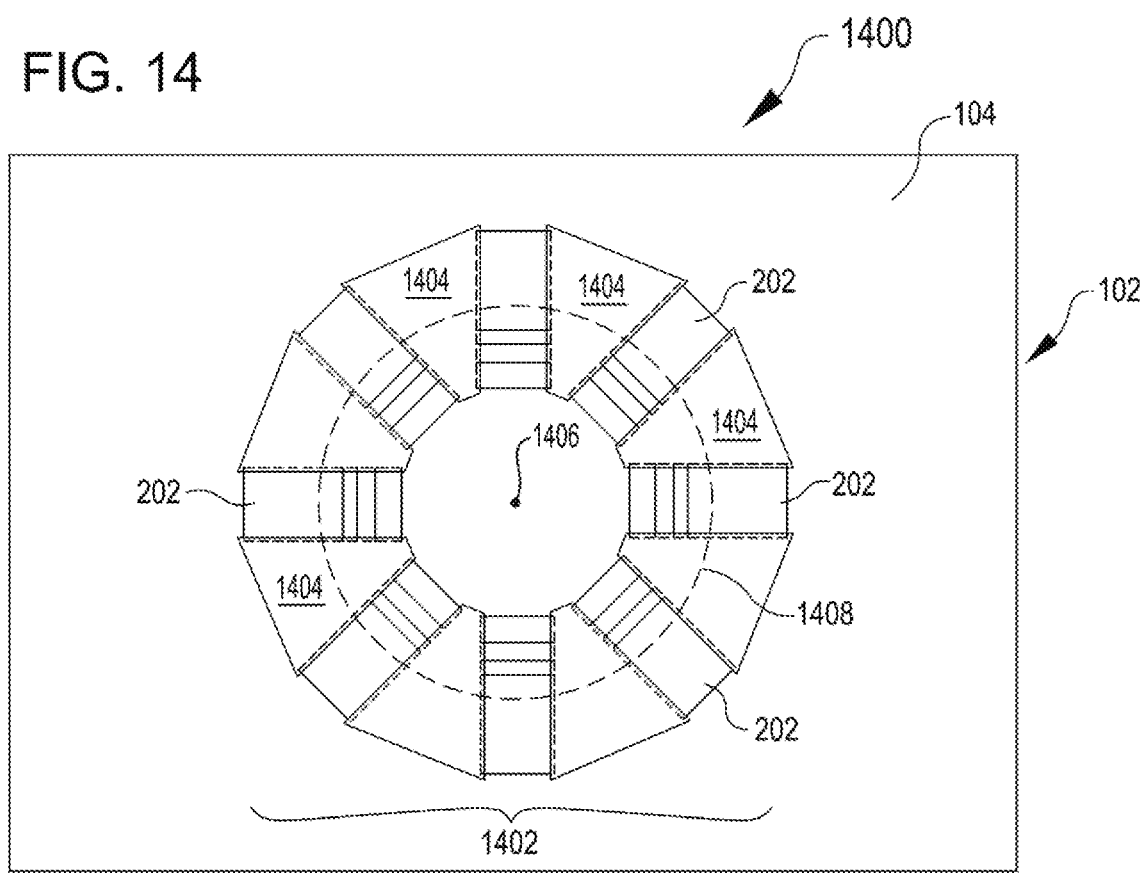
FIG. 14 is a top view schematic illustrating another example system for passively exhausting warm air from a structure, in accordance with various embodiments.

FIG. 14 is a top view schematic illustrating an example of an alternative embodiment of a passive exhaust system 1400 having a curved array 1402 of modules 202 arrayed on a roof 104 of a structure 102, in accordance with embodiments. In the system 1400, a curved array 1402 may be centered on a point 1406 on the roof 104. The curved array 1402 may be arranged along a circular, or approximately circular, path 1408. In some cases, the path 1408 can be arranged of multiple curved segments of varying arcs defining a closed path. In some cases, the path 1408 may be defined by multiple straight or curved segments. In some cases, the path 1408 may be open at one or more sides. In accordance with embodiments, modules 202 may be arranged along the path 1408 and connected with the roof 104 via voids in the roof (not shown). The modules 202 may be oriented such that exhaust faces 206 of each module 202 face toward an interior of the path 1408, or toward a center point 1406 of the array 1402. In some embodiments, panels 1404 may be connected with the modules 202 of the array 1402 for directing airflow over the modules 202 that might otherwise between the modules. In some cases, additional paths may be arranged outside the array 1402 for connecting additional modules in a secondary array of rings.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A passive exhaust module for a roof of a structure, the roof comprising a flat portion and an aperture through the flat portion, wherein the aperture is positioned such that warm exhaust air in the structure flows through the aperture, the passive exhaust module comprising:
    a planar intake face comprising an intake opening configured to fluidly connect the intake opening with the aperture to receive warm exhaust air from the structure;
    a planar exhaust face oriented orthogonal to the planar intake face, wherein the planar exhaust face has an exhaust opening configured to exhaust air directly to an exterior environment, wherein the exhaust opening extends to an upper extent of an interior volume of the passive exhaust module when the planar intake face is oriented horizontally; and
    a conduit between the planar exhaust face and the planar intake face, wherein the conduit comprises a sloped face connected with the planar exhaust face and the planar intake face opposite the planar exhaust face and configured to direct air flowing from the planar intake face to the exhaust opening, and wherein the sloped face spans a vertical height of the planar exhaust face.

2. The passive exhaust module of claim 1, wherein the planar intake face, the planar exhaust face, and the sloped face are arranged in a triangular shape.

3. The passive exhaust module of claim 1, wherein:
    a top end of the sloped face connects with the planar exhaust face; and
    a bottom end of the sloped face connects with the planar intake face.

4. The passive exhaust module of claim 3, wherein the sloped face is planar from the bottom end to the top end of the sloped face.

5. The passive exhaust module of claim 1, further comprising a catchment connected with an interior perimeter of the passive exhaust module, wherein the catchment is configured to capture condensation inside the passive exhaust module.

6. The passive exhaust module of claim 1, further comprising an insulation layer abutting one or more interior surfaces of the passive exhaust module.

7. The passive exhaust module of claim 1, further comprising a filter element connected with the passive exhaust module proximate the planar exhaust face and arranged to prevent entry of debris through the exhaust opening into the passive exhaust module.

8. The passive exhaust module of claim 1, further comprising a series of baffles connected with the planar exhaust face and arranged to prevent entry of debris or water through the exhaust opening into the passive exhaust module.

9. The passive exhaust module of claim 1, further comprising a series of active baffles connected with the planar exhaust face and configured to close when a reversed flow of air flows into the passive exhaust module through the exhaust opening.

10. The passive exhaust module of claim 1, further comprising an access hatch on a lateral side surface of the passive exhaust module.

11. The passive exhaust module of claim 1, further comprising a hood configured to direct an airflow over the passive exhaust module.

* * * * *